(12) United States Patent
Yosui et al.

(10) Patent No.: US 9,935,352 B2
(45) Date of Patent: Apr. 3, 2018

(54) COMPOSITE TRANSMISSION LINE AND ELECTRONIC DEVICE

(71) Applicant: Murata Manufacturing Co., Ltd., Nagaokakyo-shi, Kyoto-fu (JP)

(72) Inventors: Kuniaki Yosui, Nagaokakyo (JP); Naoki Gouchi, Nagaokakyo (JP); Nobuo Ikemoto, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/402,276

(22) Filed: Jan. 10, 2017

(65) Prior Publication Data

US 2017/0149111 A1 May 25, 2017

Related U.S. Application Data

(63) Continuation of application No. PCT/JP2016/061345, filed on Apr. 7, 2016.

(30) Foreign Application Priority Data

Apr. 9, 2015 (JP) .................................. 2015-079988

(51) Int. Cl.
*H05K 7/00* (2006.01)
*H01P 3/08* (2006.01)
(Continued)

(52) U.S. Cl.
CPC ............ *H01P 3/08* (2013.01); *H01B 7/0208* (2013.01); *H01B 11/002* (2013.01); *H05K 1/0237* (2013.01); *H05K 1/14* (2013.01)

(58) Field of Classification Search
CPC .. H05K 1/0296; H05K 1/0298; H05K 1/0218; H05K 1/186; H05K 2201/09218;
(Continued)

(56) References Cited

U.S. PATENT DOCUMENTS 5,912,809 A * 6/1999 Steigerwald ......... H05K 1/0262
174/255
9,698,487 B2 * 7/2017 Sudo ....................... H01Q 9/42
(Continued)

FOREIGN PATENT DOCUMENTS

JP 11-282592 A 10/1999
JP 2001-251060 A 9/2001
(Continued)

OTHER PUBLICATIONS

Official Communication issued in International Patent Application No. PCT/JP2016/061345, dated Jun. 28, 2016.

*Primary Examiner* — Binh Tran
(74) *Attorney, Agent, or Firm* — Keating & Bennett, LLP

(57) ABSTRACT

A composite transmission line includes a laminated insulator including insulator layers, signal transmission lines including first and second signal transmission lines and a power transmission line. The power transmission line includes a power transmission conductor pattern along the insulator layers, and an interlayer connection conductor that interlayer-connects power transmission conductor patterns. The first signal conductor pattern of the first signal transmission line, the second signal conductor pattern of the second signal transmission line, and the power transmission conductor pattern are parallel or substantially parallel to each other on the insulator layers that are mutually different from each other. The first and second signal conductor patterns interpose a first ground conductor in the laminating direction of the insulator layers. The power transmission line is in a side portion of the first signal conductor pattern.

20 Claims, 16 Drawing Sheets

(51) Int. Cl.
  *H01B 7/02* (2006.01)
  *H01B 11/00* (2006.01)
  *H05K 1/02* (2006.01)
  *H05K 1/14* (2006.01)
  *H05K 1/18* (2006.01)
  *H05K 9/00* (2006.01)
  *H05K 1/11* (2006.01)

(58) Field of Classification Search
  CPC . H05K 2201/09236; H05K 2201/0929; H05K 2201/093; H05K 2201/09345; H05K 2201/09354; H05K 1/188; H05K 1/0224; H05K 2201/0707; H05K 1/0242; H01P 3/003; H01P 3/026; H01P 3/08; H01P 5/028
  USPC .............. 361/748, 753, 777, 778, 816, 818; 174/261; 333/128, 238, 246
  See application file for complete search history.

(56) References Cited

U.S. PATENT DOCUMENTS

| | | |
|---|---|---|
| 2002/0000901 A1 | 1/2002 | Kuhara et al. |
| 2004/0211591 A1* | 10/2004 | Kumakura .......... H01L 23/3114 174/256 |
| 2008/0035369 A1* | 2/2008 | Joodaki ................ H05K 1/0218 174/255 |
| 2010/0201459 A1* | 8/2010 | Kawaguchi ............... H01P 3/08 333/204 |
| 2014/0176265 A1 | 6/2014 | Kato et al. |
| 2014/0262429 A1 | 9/2014 | Hayashi |

FOREIGN PATENT DOCUMENTS

| | | |
|---|---|---|
| JP | 2003-309378 A | 10/2003 |
| JP | 2006-351647 A | 12/2006 |
| JP | 2014-179297 A | 9/2014 |
| JP | 2014-229442 A | 12/2014 |
| WO | 01/50482 A1 | 7/2001 |
| WO | 2013/190859 A1 | 12/2013 |

* cited by examiner

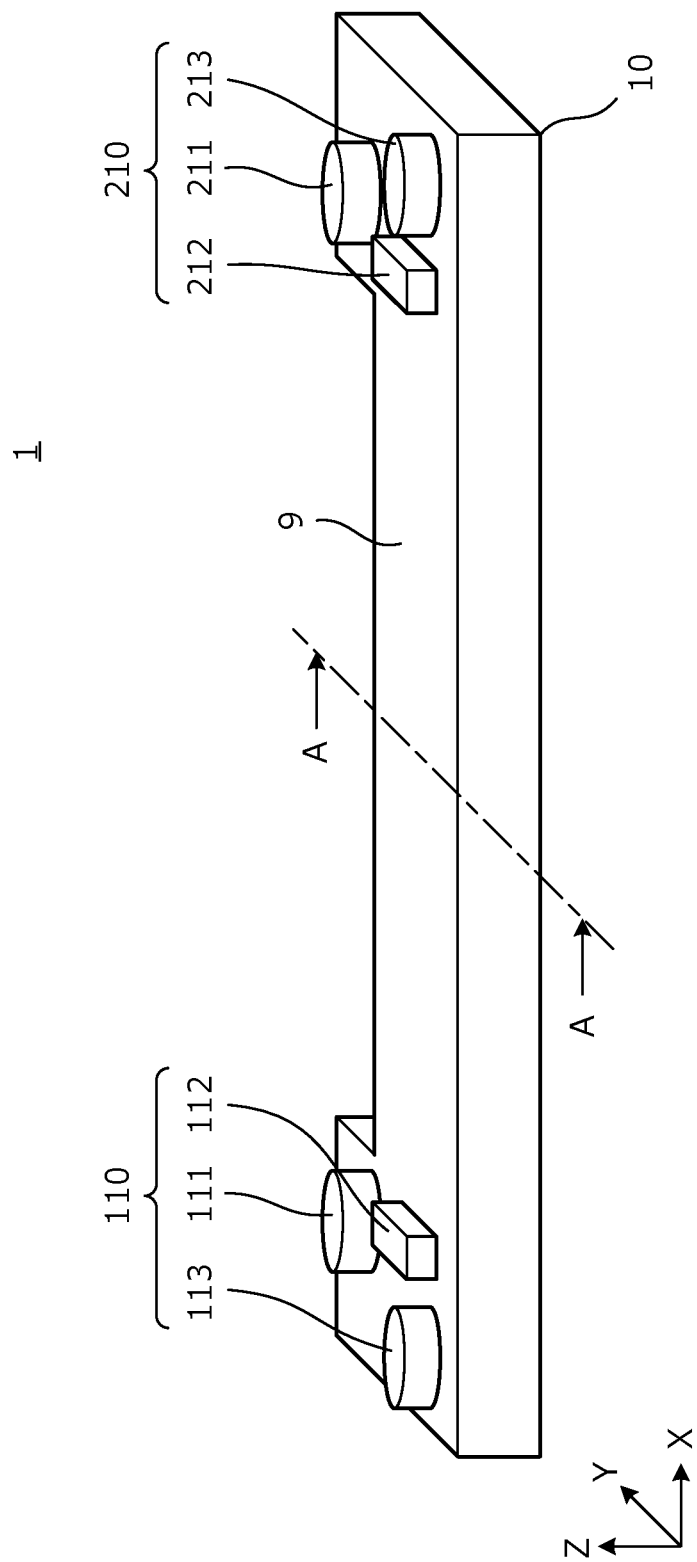

COMPOSITE TRANSMISSION LINE AND ELECTRONIC DEVICE

CROSS REFERENCE TO RELATED APPLICATIONS

This application claims the benefit of priority to Japanese Patent Application No. 2015-079988 filed on Apr. 9, 2015 and is a Continuation Application of PCT Application No. PCT/JP2016/061345 filed on Apr. 7, 2016. The entire contents of each application are hereby incorporated herein by reference.

BACKGROUND OF THE INVENTION

1. Field of the Invention

The present invention relates to a transmission line incorporated in an electronic device, and particularly to a composite transmission line provided with a plurality of lines, and an electronic device provided with such a composite transmission line.

2. Description of the Related Art

Conventionally, various kinds of transmission lines that transmit a high frequency signal have been devised. For example, Japanese Patent Laid-Open publication No. 2014-179297 discloses a multiple-conductor flat cable that has an analog signal line and a digital signal line. The multiple-conductor flat cable includes an analog cable portion formed such that a plurality of ground signal lines and a plurality of analog signal lines are alternately arranged side by side across a signal transmission direction and each pair of the ground signal lines and the analog signal lines are joined while being electrically insulated from each other. In addition, a digital cable portion is formed such that a plurality of digital signal lines are arranged side by side across the signal transmission direction and each pair of the digital signal lines are connected while being electrically insulated from each other. Further, the analog cable portion and the digital cable portion are arranged in parallel to each other in an unfolded state, and the analog cable portion is rolled up or folded in a direction across the signal transmission direction so as to cover the digital cable portion.

In such a conventional multiple-conductor flat cable disclosed in Japanese Patent Laid-Open publication No. 2014-179297, necessary signal lines are combined to configure a cable that individually transmits various kinds of signals.

The multiple-conductor flat cable that transmits various kinds of signals is capable of transmitting the various kinds of signals by one cable and is thus also useful as a component in an electronic device that is required to be small in size. For example, a plurality of circuit boards are incorporated in the housing of an electronic device, and the plurality of circuit boards are connected by a multiple-conductor flat cable.

In a case in which not only signal transmission but also power transmission is performed in a small transmission line incorporated in the housing of such an electronic device, in a transmission line that transmits various kinds of signals, it is important to prevent the size (thickness and width) from increasing and to also significantly reduce interference between lines.

SUMMARY OF THE INVENTION

In view of the foregoing, preferred embodiments of the present invention provide a composite transmission line that enables power transmission as well as signal transmission.

In addition, preferred embodiments of the present invention also provide a composite transmission line capable of significantly reducing or preventing interference between lines effectively without making a structure complicated.

A composite transmission line according to a preferred embodiment of the present invention includes a plurality of signal transmission lines, a power transmission line, and a laminated insulator in which a plurality of insulator layers are laminated on each other, the laminated insulator including the plurality of signal transmission lines and the power transmission line, and the plurality of signal transmission lines include at least a first signal transmission line and a second signal transmission line, the first signal transmission line includes a first signal conductor pattern, the second signal transmission line includes a second signal conductor pattern, the power transmission line includes a power transmission conductor pattern defined by power transmission conductor patterns along a plurality of insulator layers of the laminated insulator, and a first interlayer connection conductor that interlayer-connects the power transmission conductor patterns, the first signal conductor pattern, the second signal conductor pattern, and the power transmission conductor pattern extend in a same or substantially same direction, the first signal conductor pattern and the second signal conductor pattern interpose a first ground conductor between the first signal conductor pattern and the second signal conductor pattern in a laminating direction of the plurality of insulator layers, and the power transmission line is in a side portion of the first signal conductor pattern.

According to the above configuration, a composite transmission line capable of being significantly reduced or prevented from increasing in size due to the installation of a power transmission line and of simultaneously performing signal transmission and power transmission is obtained. In addition, since being provided with power transmission conductor patterns along with a plurality of insulator layers, the power transmission line is able to decrease a conductor loss while being small and to significantly reduce variation in a power supply voltage due to a voltage drop.

A power transmission line according to a preferred embodiment of the present invention may preferably be located in a side portion of the first signal conductor pattern and the second signal conductor pattern. Accordingly, the number of power transmission conductor patterns and first interlayer connection conductors that define a power transmission line is able to be increased, which is able to further decrease a conductor loss.

The first signal transmission line may preferably be an unbalanced line for a high-frequency analog signal, for example, and the second signal transmission line may preferably be a differential line for a digital signal, for example.

The power transmission line may preferably be located at a position (height) closer to the first signal conductor pattern than to the second signal conductor pattern, in the laminating direction of the plurality of insulator layers. Accordingly, interference between the first signal transmission line and the second signal transmission line through the power transmission line is significantly reduced or prevented.

A number of second signal conductor patterns may preferably be larger than the number of first signal conductor patterns. Accordingly, the power transmission line is structure such that a position in which the power transmission line extends is shifted in a direction of an insulator layer on which the first signal conductor pattern that is smaller in number than the second signal conductor patterns is located, and thus a space in a width direction is able to be expanded. In other words, space efficiency is able to be achieved. In addition, since a relatively large number of conductors become difficult to be overlapped in the thickness direction, a flexible property becomes difficult to be obstructed.

In a power transmission line according to a preferred embodiment of the present invention, a second ground conductor may preferably be located on a side opposite to the first ground conductor, with respect to the first signal conductor pattern. Accordingly, a better shielding effect of the surface on the side on which the second ground conductor is located is achieved, and higher isolation between the second signal transmission line and the power transmission line, and the first signal transmission line is achieved.

The second ground conductor and the first ground conductor may preferably be connected to each other through a second interlayer connection conductor, at a position closer to the power transmission line than to the first signal conductor pattern. Accordingly, while the shielding effect is further improved, the isolation between the first signal transmission line and the power transmission line is able to be improved.

The second ground conductor and the first ground conductor may preferably be connected to each other through a third interlayer connection conductor, at a position on the opposite side of the power transmission line, with respect to the first signal conductor pattern. Accordingly, the isolation between the outside and the second signal conductor pattern, and the first signal conductor pattern is improved.

The power transmission line may preferably be electrically connected to at least the second ground conductor. Accordingly, at least the second ground conductor defines and functions as a power transmission line, and a conductor loss of the power transmission line is reduced and heat dissipation is increased. In addition, the power transmission line defines and functions as a ground conductor of the first signal transmission line, and the shielding property of the first signal transmission line is increased.

A third ground conductor may preferably be located on a side opposite to the first ground conductor, with respect to the second signal conductor pattern, and the power transmission line may preferably be electrically connected to the third ground conductor. Accordingly, the second ground conductor and the third ground conductor define and function as a power transmission line, and a conductor loss of the power transmission line is reduced and heat dissipation is increased. In addition, the power transmission line defines and functions as a ground conductor of the first signal transmission line and the second signal transmission line, and the shielding property of the first signal transmission line and the second signal transmission line is increased.

In a power transmission line according to a preferred embodiment of the present invention, a power transmission ground conductor that is electrically separated from the first ground conductor may preferably be further provided. Accordingly, higher isolation between the power transmission line and the signal transmission line is achieved.

In a power transmission line according to a preferred embodiment of the present invention, a third ground conductor may preferably be located on a side opposite to the first ground conductor, with respect to the second signal conductor pattern. Accordingly, a better shielding effect of the surface on the side on which the third ground conductor is located is achieved, and higher isolation between the first signal transmission line and the power transmission line is achieved.

The third ground conductor and the first ground conductor may preferably be connected to each other through a fourth interlayer connection conductor. Accordingly, the isolation between the outside, the power transmission line, and the first signal conductor pattern, and the second signal conductor pattern is improved.

The fourth interlayer connection conductor may preferably be located on both sides across the second signal conductor pattern in the width direction of the interlayer connection conductor. Accordingly, the isolation between the outside, the power transmission line, and the first signal conductor pattern, and the second signal conductor pattern is further improved.

The power transmission line may preferably be disposed over the plurality of insulator layers of the laminated insulator from an insulator layer including the second ground conductor to an insulator layer including the third ground conductor. Accordingly, the space from the insulator layer including the second ground conductor to the insulator layer including the third ground conductor is used effectively and thus a conductor loss of the power transmission line is reduced.

In a power transmission line according to a preferred embodiment of the present invention, an external connection terminal that is electrically connected to the first signal transmission line and the second signal transmission line may preferably be located near or adjacent to the second signal transmission line of the laminated insulator. Accordingly, the total length of a connection path between the external connection terminal and the first and second transmission lines becomes short, and an unwanted parasitic component is significantly reduced or prevented. In addition, since it becomes easy to make a space to locate wiring smaller, it becomes easy to miniaturize the size of the entire composite transmission line.

In a power transmission line according to a preferred embodiment of the present invention, the laminated insulator may preferably have flexibility. Accordingly, the composite transmission line is able to be located along a limited space in an electronic device.

In a power transmission line according to a preferred embodiment of the present invention, a bent portion that bends in a direction perpendicular or substantially perpendicular to the laminating direction of the plurality of insulator layers may preferably be provided, and, in a plan view of the plurality of insulator layers, the power transmission line may preferably be located closer to an inner peripheral side than to the first signal conductor pattern and the second signal conductor pattern. Accordingly, since the curvature radius of the first signal conductor pattern and the second signal conductor pattern in the bent portion is kept large and distance is able to be separated, the interference between the first signal conductor patterns or between the second signal conductor patterns in the bent portion is reduced. In addition, since, in the bent portion, the power transmission line is located between the first signal conductor patterns, the first signal conductor patterns are shielded by the power transmission line and thus the interference between the first signal conductor patterns is also significantly reduced or prevented even by such shielding action. Similarly, the interference between the second signal conductor patterns is significantly reduced or prevented.

In a power transmission line according to a preferred embodiment of the present invention, the power transmission line may preferably be located in the side portion located on both sides of the plurality of signal transmission lines. Accordingly, in the vertical section of the laminated insulator, at least the power transmission line has a symmetrical shape, which significantly reduces or prevents the laminated insulator from being warped or twisted.

An electronic device according to a preferred embodiment of the present invention includes the composite transmission line according to any one of the above-described preferred embodiments of the present invention, a first high-frequency circuit, and a second high-frequency circuit, and the first high-frequency circuit and the second high-frequency circuit are connected to each other by the composite transmission line. Accordingly, a smaller electronic device is provided.

According to various preferred embodiments of the present invention, a composite transmission line that is capable of transmitting various kinds of signals and also transmitting power while being small is obtained.

In addition, according to various preferred embodiments of the present invention, a composite transmission line in which the interference between lines is significantly reduced or prevented effectively while the structure is not made complicated is able to be obtained.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 1 is a perspective view of a composite transmission line 1 according to a first preferred embodiment of the present invention.

DETAILED DESCRIPTION OF THE PREFERRED EMBODIMENTS

Figure 2A:
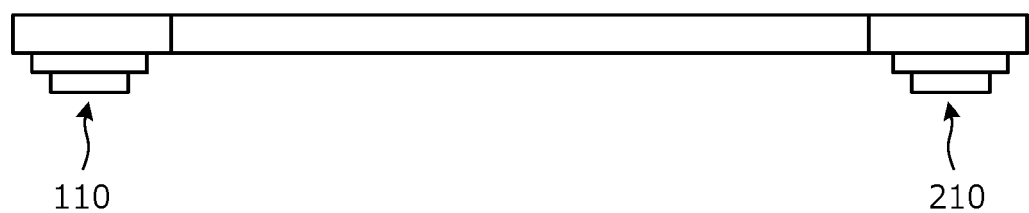
FIG. 2A is a front view of the composite transmission line 1 and FIG. 2B is a view illustrating a state in which the composite transmission line 1 is formed.

Hereinafter, a plurality of preferred embodiments of the present invention will be described with reference to the attached drawings and several specific examples. In the drawings, components and elements assigned with the same reference numerals or symbols will represent identical components and elements. In preferred embodiments after the second preferred embodiment, a description of matters common to the first preferred embodiment will be omitted, and different matters are mainly described. In particular, the same operational effects by the same configuration will not be described one by one for each preferred embodiment.

First Preferred Embodiment

Figure 2B:
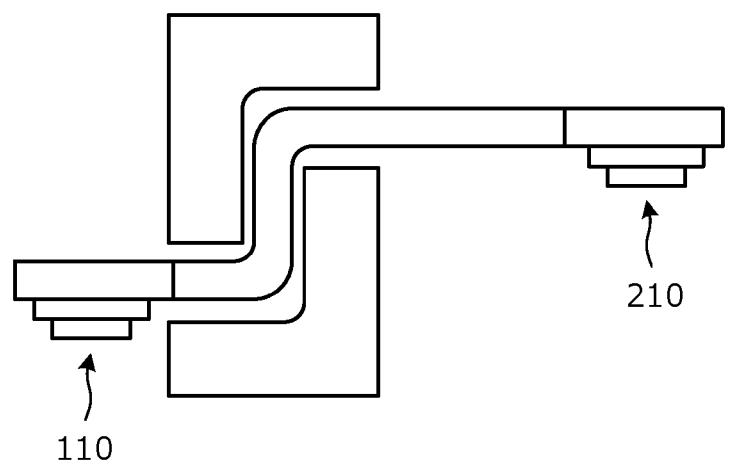

FIG. 1 is a perspective view of a composite transmission line 1 according to a first preferred embodiment of the present invention. FIG. 2A is a front view of the composite transmission line 1 and FIG. 2B is a view illustrating a state in which the composite transmission line 1 is formed.

The composite transmission line 1 preferably is a composite transmission line in which two signal transmission lines and one power transmission line are provided in a laminated insulator 10. The composite transmission line (hereinafter simply referred to as "transmission line") 1 includes a first signal transmission line, a second signal transmission line, and a power transmission line (power supply line).

The transmission line 1 is long in an X direction and performs signal transmission and power transmission (supply of a power supply voltage) in the X direction. The Y direction illustrated in FIG. 1 is a width direction of the transmission line 1, and the Z direction is a thickness direction of the transmission line 1.

The transmission line 1 may preferably be provided with external connection terminals 110 and 210 in order to be used as a cable. The external connection terminal 110 is defined by connectors 111, 112, and 113, and the external connection terminal 210 is defined by connectors 211, 212, and 213. First signal transmission line connectors 111 and 211 are connectors connected to the opposite ends of the first signal transmission line. Second signal transmission line connectors 112 and 212 are connectors connected to the opposite ends of the second signal transmission line. Power transmission line connectors 113 and 213 are connectors connected to the opposite ends of the power transmission line.

Since each insulator layer of the laminated insulator 10 of the transmission line 1 is preferably made of a thermoplastic resin base material such as a liquid crystal polymer and has flexibility, a large portion of the transmission line 1 has flexibility. The transmission line 1 is incorporated in an electronic device while keeping the shape of a straight line as illustrated in FIG. 2A or is incorporated in an electronic device preferably by being nipped with a tool and formed into a predetermined shape by being heated locally as illustrated in FIG. 2B. Since the transmission line 1, if being formed in this way, will keep the predetermined shape, the transmission line 1 is able to be easily incorporated into an electronic device while keeping the desired shape, and thus workability is increased.

Figure 3:
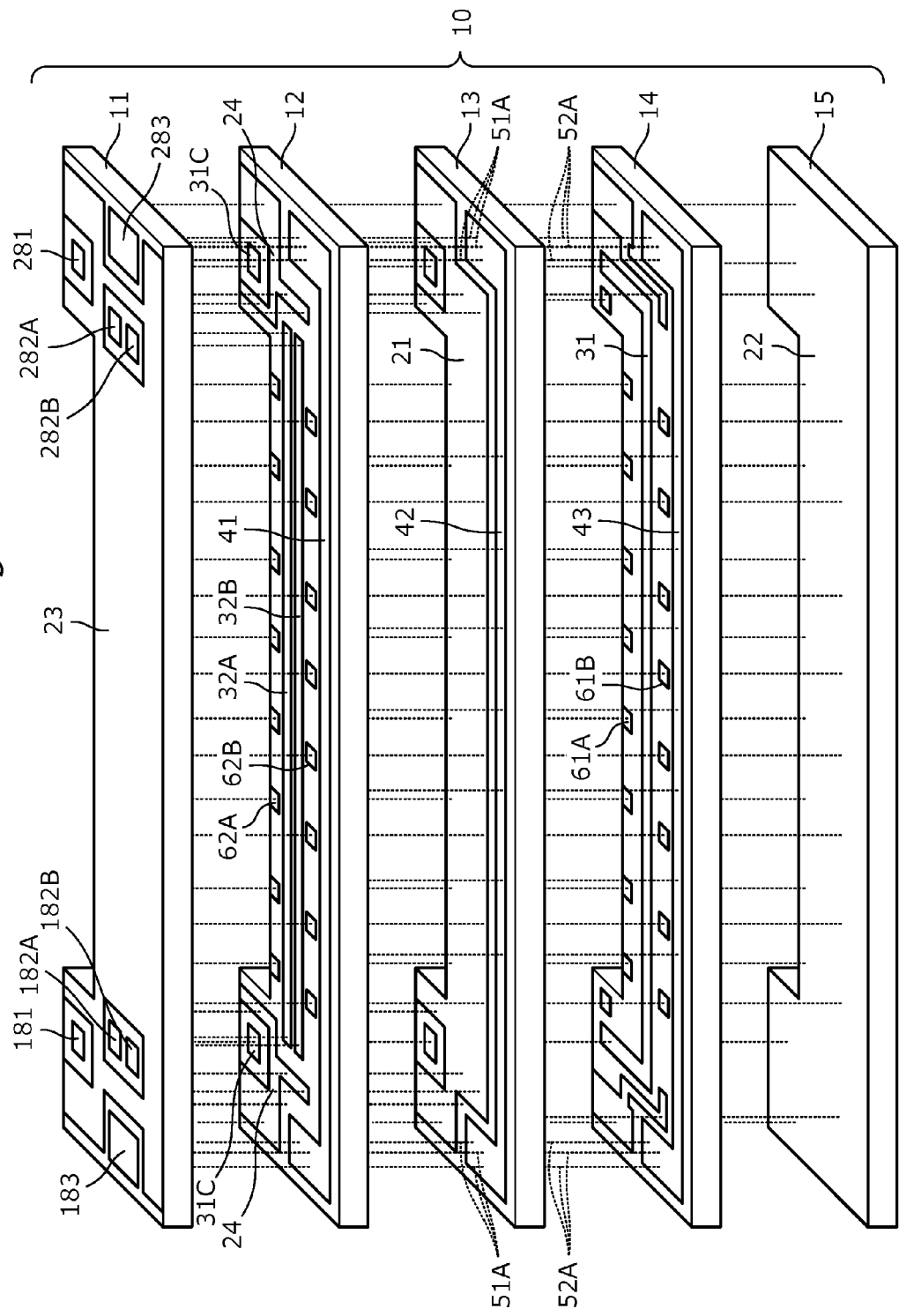
FIG. 3 is an exploded perspective view of the composite transmission line 1.
Figure 4:
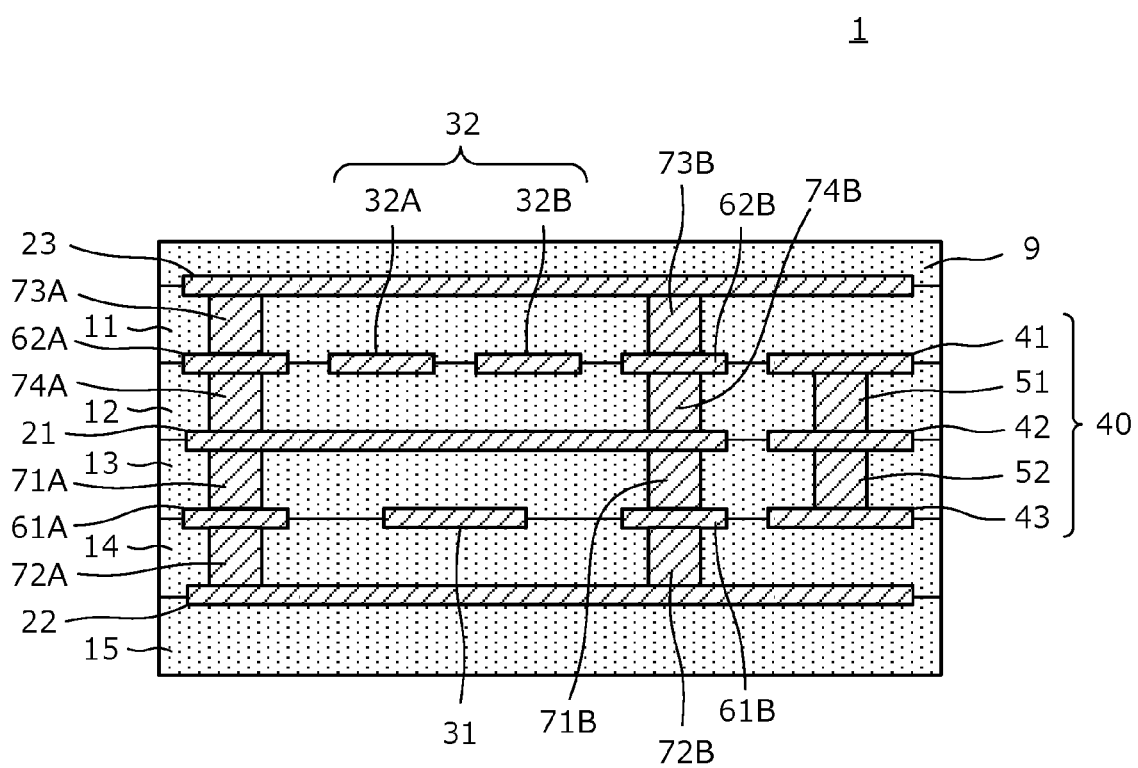
FIG. 4 is a cross-sectional view taken along a line A-A illustrated in FIG. 1.

FIG. 3 is an exploded perspective view of the transmission line 1. FIG. 4 is a cross-sectional view taken along a line A-A illustrated in FIG. 1. In FIG. 3, a protective insulating film 9 on the surface of the transmission line 1 is omitted.

The transmission line 1 is provided with the laminated insulator 10 in which insulator layers 11, 12, 13, 14, and 15 are laminated on each other, a plurality of conductor patterns extending along the insulator layers 11, 12, 13, 14, and 15 inside the laminated insulator 10, and a plurality of interlayer connection conductors extending in the laminated insulator 10.

A first ground conductor 21 is provided on the upper surface of the insulator layer 13, a second ground conductor 22 is provided on the upper surface of the insulator layer 15, and a third ground conductor 23 is provided on the upper surface of the insulator layer 11.

A first signal conductor pattern 31 is provided on the upper surface of the insulator layer 14, and second signal conductor patterns 32A and 32B are provided on the upper surface of the insulator layer 12. The first signal conductor pattern 31 is located between the first ground conductor 21 and the second ground conductor 22. In addition, the second signal conductor patterns 32A and 32B are located between the first ground conductor 21 and the third ground conductor 23. In other words, the first signal conductor pattern 31 and the second signal conductor patterns 32A and 32B may preferably interpose the first ground conductor 21 between the first signal conductor pattern 31 and the second signal conductor patterns 32A and 32B in the laminating direction (the Z direction) of the insulator layer.

Conductor patterns 61A and 61B are located on the upper surface of the insulator layer 14, and interlayer connection conductors 71A and 71B that connect the first ground conductor 21 and the conductor patterns 61A and 61B are located in the insulator layer 13. In addition, interlayer connection conductors 72A and 72B that connect the second ground conductor 22 and the conductor patterns 61A and 61B are located in the insulator layer 14. Therefore, the second ground conductor 22 and the first ground conductor 21 are interlayer-connected to each other by the interlayer connection conductors 71A, 71B, 72A, and 72B and the conductor patterns 61A and 61B. The interlayer connection conductor 71B and 72B corresponds to the "second interlayer connection conductor", and the interlayer connection conductor 71A and 72A corresponds to the "third interlayer connection conductor".

Conductor patterns 62A and 62B are located on the upper surface of the insulator layer 12, and interlayer connection conductors 73A and 73B that connect the third ground conductor 23 and the conductor patterns 62A and 62B are located in the insulator layer 11. In addition, interlayer connection conductors 74A and 74B that connect the first ground conductor 21 and the conductor patterns 62A and 62B are located in the insulator layer 12. Therefore, the third ground conductor 23 and the first ground conductor 21 are interlayer-connected to each other by the interlayer connection conductors 73A, 73B, 74A, and 74B and the conductor patterns 62A and 62B. The interlayer connection conductor 73A, 73B, 74A and 74B corresponds to the "fourth interlayer connection conductor".

Power transmission conductor patterns 41, 42, and 43 that extend along the first signal conductor pattern 31 and the second signal conductor patterns 32A and 32B are respectively provided on the upper surface of the insulator layers 12, 13, and 14. An interlayer connection conductor 51 that interlayer-connects the power transmission conductor patterns 41 and 42 is provided in the insulator layer 12, and an interlayer connection conductor 52 that interlayer-connects the power transmission conductor patterns 42 and 43 is provided in the insulator layer 13. The interlayer connection conductor 51 and 52 corresponds to the "first interlayer connection conductor".

The first signal conductor pattern 31, the second signal conductor patterns 32A and 32B, and the power transmission conductor patterns 41, 42, and 43 are parallel or substantially parallel to each other on the plurality of insulator layers of the laminated insulator 10 that are mutually different from each other.

A power transmission line 40 is located, in the present preferred embodiment, in a side portion of the first signal conductor pattern 31 and the second signal conductor patterns 32A and 32B.

The first signal conductor pattern 31, the first ground conductor 21, and the second ground conductor 22 define the first signal transmission line. In addition, the second signal conductor patterns 32A and 32B, the first ground conductor 21, and the third ground conductor 23 define the second signal transmission line. The power transmission conductor patterns 41, 42, and 43 and the interlayer connection conductors 51 and 52 define the power transmission line 40. The first ground conductor 21, the second ground conductor 22, and the third ground conductor 23 also define and function as a power transmission ground conductor.

The first signal transmission line is an unbalanced line that transmits a high-frequency analog signal, for example, and the second signal transmission line is a differential (balanced) line that transmits a digital signal, for example. The power transmission line 40 is a power supply line that supplies a power supply voltage, for example.

According to the present preferred embodiment, a composite transmission line capable of being significantly reduced or prevented from increasing in size due to the installation of a power transmission line and of simultaneously performing signal transmission and power transmission is obtained. In addition, since being provided with power transmission conductor patterns along with a plurality of insulator layers, the power transmission line is able to decrease a conductor loss though being small and to significantly reduce variation in a power supply voltage due to a voltage drop.

Moreover, according to the present preferred embodiment, since the second signal transmission line defined by the second signal conductor patterns 32A and 32B is a differential (balanced) line, the distance between the second signal conductor patterns 32A and 32B and the first ground conductor 21 and the distance between the second signal conductor patterns 32A and 32B and the third ground conductor 23 hardly affect the characteristic impedance of the line. In contrast, the first signal transmission line defined by the first signal conductor pattern 31, the first ground conductor 21, and the second ground conductor 22 is an unbalanced transmission line, and, in order to set a predetermined characteristic impedance (50 Ohm, for example), the distance between the first ground conductor 21 and the second ground conductor 22 is not able to be significantly reduced. By arranging the power transmission line 40 in the side portion of this first signal transmission line, the power transmission line 40 is able to be within a limited thickness range. In other words, an increase in thickness is significantly reduced or prevented.

In addition, in the present preferred embodiment, since the second ground conductor 22 is located on the side opposite to the first ground conductor 21 with respect to the first signal conductor pattern 31, in other words, since the first signal conductor pattern has a stripline structure, a higher shield effect of the first signal transmission line is achieved, and higher isolation between the first signal transmission line and the second signal transmission line is achieved.

Moreover, since the second ground conductor 22 and the first ground conductor 21 are interlayer-connected to each other by the interlayer connection conductors 71A, 71B, 72A, and 72B and the conductor patterns 61A and 61B, the first signal transmission line is shielded by such interlayer connection portions and the first and second ground conductors.

Further, since the interlayer connection conductors 71B, 72B, 73B, and 74B are located between the first signal conductor pattern 31 and the power transmission line 40, a portion between the first signal conductor pattern 31 and the second signal conductor pattern 32, and the power transmission line 40 is electromagnetically shielded and the unwanted coupling in the portion is significantly reduced or prevented effectively. Accordingly, the unwanted coupling between the first signal transmission line and the power transmission line 40 and the indirect unwanted coupling between the first signal transmission line and the second signal transmission line through the power transmission line 40 are significantly reduced or prevented effectively.

In addition, since being interlayer-connected by the interlayer connection conductors 73A, 73B, 74A, and 74B and the conductor patterns 62A and 62B, the second signal transmission line is shielded by such interlayer connection portions and the first and third ground conductors. Accordingly, the isolation between the first signal transmission line and the second signal transmission line and the isolation between the first and second signal transmission lines and the power transmission line located in the side portion are improved.

As illustrated in FIG. 3, a first end of the first signal conductor pattern 31 is connected to a first signal transmission line connector connection electrode 181 through the interlayer connection conductor and the conductor pattern, and a second end of the first signal conductor pattern 31 is connected to a first signal transmission line connector connection electrode 281 through the interlayer connection conductor and the conductor pattern.

The first ends of the second signal conductor patterns 32A and 32B are respectively connected to second signal transmission line connector connection electrodes 182A and 182B through the interlayer connection conductor and the conductor pattern, and the second ends of the second signal conductor patterns 32A and 32B are respectively connected to second signal transmission line connector connection electrodes 282A and 282B through the interlayer connection conductor and the conductor pattern.

It is to be noted that, while a conductor pattern 31C electrically connected to the first signal transmission line is preferably located on the same layer (insulator layer) 12 as the second signal conductor patterns 32A and 32B, a ground conductor pattern 24 is located between the conductor pattern 31C and the second signal conductor patterns 32A and 32B. Since the first signal conductor pattern (conductor pattern 31C) and the second signal conductor patterns 32A and 32B are shielded by the ground conductor pattern 24, the isolation between the first signal transmission line and the second signal transmission line is maintained.

The first end of each of the power transmission conductor patterns 41, 42, and 43 is connected to a power transmission line connector connection electrode 183 through the interlayer connection conductor and the conductor pattern, and a second end of each of the power transmission conductor patterns 41, 42, and 43 is connected to a power transmission line connector connection electrode 283 through the interlayer connection conductor and the conductor pattern. Both the first end and the second end are connected to the power transmission line connector connection electrodes 183 and 283 through a plurality of interlayer connection conductors 51A and 51B. This structure reduces a conductor loss.

The first signal transmission line connectors 111 and 211 illustrated in FIG. 1 are respectively connected to (mounted on) the first signal transmission line connector connection electrodes 181 and 281. The second signal transmission line connector 112 illustrated in FIG. 1 is connected to (mounted on) the second signal transmission line connector connection electrodes 182A and 182B, and the second signal transmission line connector 212 is connected to (mounted on) the second signal transmission line connector connection electrodes 282A and 282B.

The power transmission line connectors 113 and 213 illustrated in FIG. 1 are respectively connected to (mounted on) the power transmission line connector connection electrodes 183 and 283.

A high-speed digital line is often defined by a differential line, and a large number of signal lines such as an MIPI (registered trademark) (Mobile Industry Processor Interface) or a USB (Universal Serial Bus) are often used. According to the present preferred embodiment, since the external connection terminals (connectors 111, 112, 211, and 212) that are electrically connected to the first signal transmission line and the second signal transmission line are located near or adjacent to the second signal transmission line of the laminated insulator 10, the total length of a connection path between the external connection terminals and the first and second transmission lines becomes short, and an unwanted parasitic component is significantly reduced or prevented. In addition, since it becomes easy to make a space to provide wiring smaller, it becomes easy to miniaturize the size of the entire composite transmission line 1.

It is to be noted that the insulator layers 11 to 15 each are an insulator sheet portion of a one-side copper-clad insulator sheet of which the one side is attached with copper foil, for example. This insulator sheet is a sheet made of a liquid crystal polymer (LCP), for example. Since the dielectric constant of a liquid crystal polymer is low, even if the signal conductor pattern and the ground conductor pattern are adjacent to each other, the capacitance component of a line is able to be significantly reduced or prevented. In addition, since the dielectric loss tangent is low, a transmission loss is able to be significantly reduced or prevented. Further, since the temperature dependence of the dielectric loss tangent is low, the characteristic change due to an environmental change is significantly reduced or prevented. Moreover, the various conductor patterns have been obtained preferably by patterning the copper foil attached on the insulator sheet. The laminated insulator 10 is formed preferably by laminating a plurality of insulator sheets and bonding the plurality of insulator sheets with heat and pressure.

Second Preferred Embodiment

According to a second preferred embodiment of the present invention, a description is given of several transmission lines that are partially different in structure from the transmission line 1 described in the first preferred embodiment.

Figure 5:
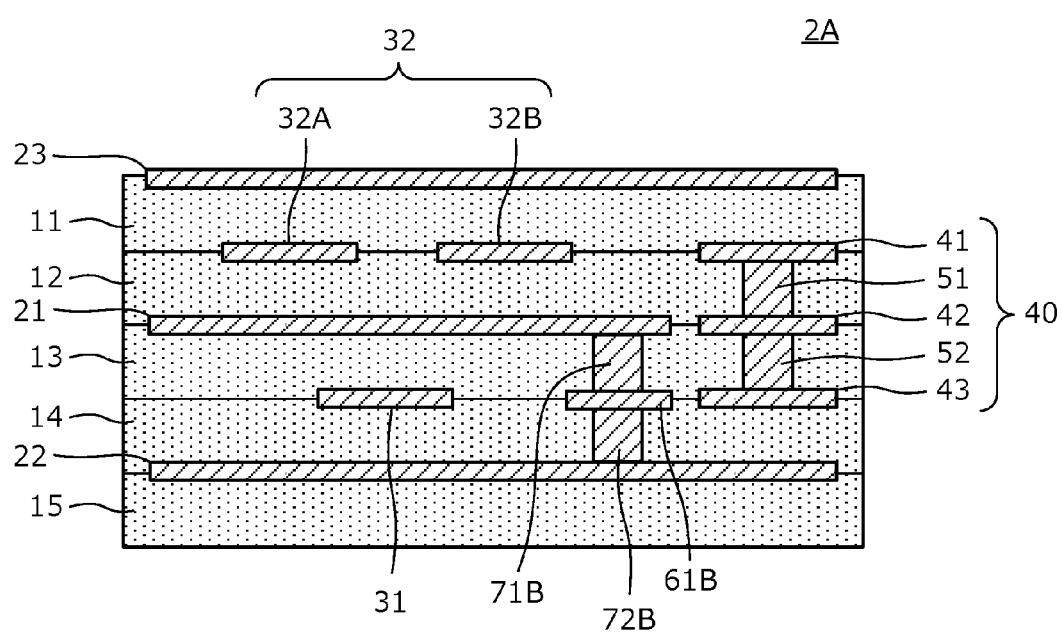
FIG. 5 is a cross-sectional view of a composite transmission line 2A according to a second preferred embodiment of the present invention.
Figure 6:
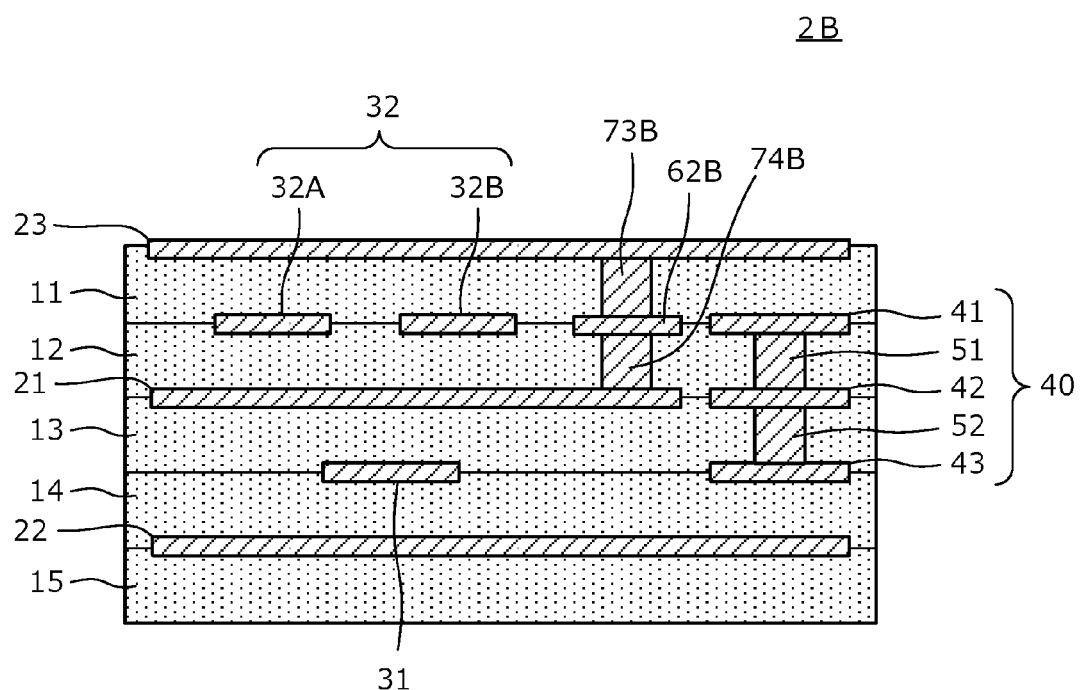
FIG. 6 is a cross-sectional view of a composite transmission line 2B according to the second preferred embodiment of the present invention.
Figure 7:
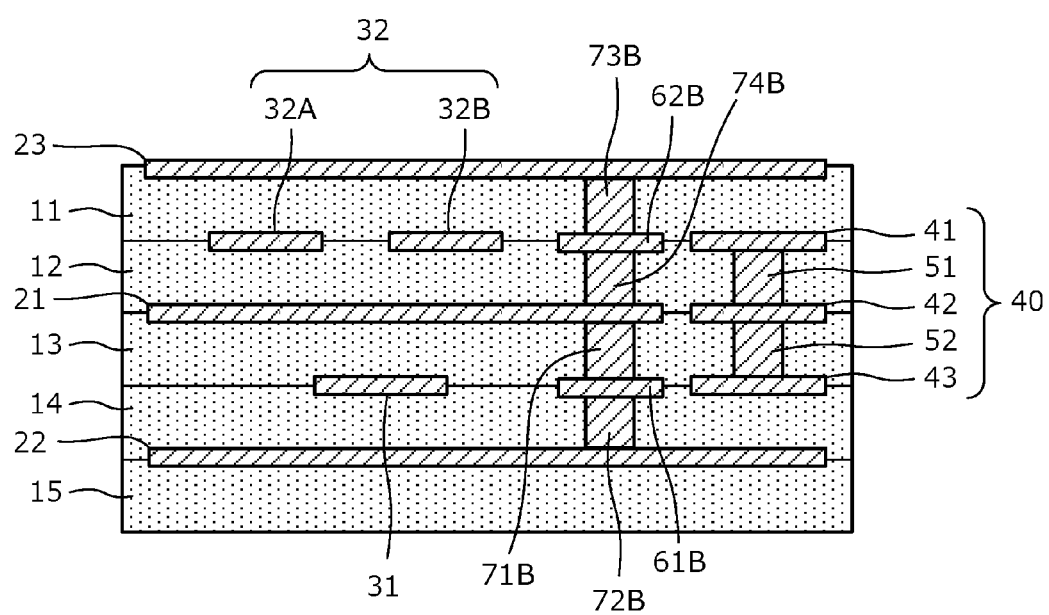
FIG. 7 is a cross-sectional view of a composite transmission line 2C according to the second preferred embodiment of the present invention.

FIG. 5 is a cross-sectional view of the transmission line 2A, FIG. 6 is a cross-sectional view of the transmission line 2B, and FIG. 7 is a cross-sectional view of the transmission line 2C. The external shape of all transmission lines is the same or substantially the same as the external shape illustrated in FIG. 1.

In the transmission line 2A illustrated in FIG. 5, the conductor pattern 61B is located on the upper surface of the insulator layer 14, and the interlayer connection conductor 71B that connects the first ground conductor 21 and the conductor pattern 61B is located in the insulator layer 13. In addition, the interlayer connection conductor 72B that connects the second ground conductor 22 and the conductor pattern 61B is located in the insulator layer 14. Therefore, the second ground conductor 22 and the first ground conductor 21 are interlayer-connected to each other by the interlayer connection conductors 71B and 72B and the conductor pattern 61B. Then, such an interlayer connection portion is located at a position close to the power transmission line 40.

In this way, since the interlayer connection portion that connects the first ground conductor 21 and the second ground conductor 22 of the first signal transmission line is located close to the power transmission line 40, a portion between the first signal conductor pattern 31 and the power transmission line 40 is electromagnetically shielded, and the unwanted coupling in the portion is significantly reduced or prevented effectively. Accordingly, the unwanted coupling between the first signal transmission line and the power transmission line 40 and the indirect unwanted coupling between the first signal transmission line and the second signal transmission line through the power transmission line 40 are significantly reduced or prevented effectively.

In the transmission line 2B illustrated in FIG. 6, the conductor pattern 62B is located on the upper surface of the insulator layer 12, and the interlayer connection conductor 73B that connects the third ground conductor 23 and the conductor pattern 62B is located in the insulator layer 11. In addition, the interlayer connection conductor 74B that connects the first ground conductor 21 and the conductor pattern 62B is located in the insulator layer 12. Therefore, the third ground conductor 23 and the first ground conductor 21 are interlayer-connected to each other by the interlayer connection conductors 73B and 74B and the conductor pattern 62B. Then, such an interlayer connection portion is located at a position close to the power transmission line 40.

In this way, since the interlayer connection portion that connects the first ground conductor 21 and the third ground conductor 23 of the second signal transmission line is located close to the power transmission line 40, a portion between the second signal conductor patterns 32A and 32B and the power transmission line 40 is electromagnetically shielded, and the unwanted coupling in the portion is significantly reduced or prevented effectively. Accordingly, the unwanted coupling between the second signal transmission line and the power transmission line 40 and the indirect unwanted coupling between the first signal transmission line and the second signal transmission line through the power transmission line 40 are significantly reduced or prevented effectively.

The transmission line 2C illustrated in FIG. 7 is a transmission line provided with a structure in which the transmission line 2A and the transmission line 2B are combined. In this transmission line 2C, the interlayer connection portion of the first ground conductor 21 and the second ground conductor 22 and the interlayer connection portion of the first ground conductor 21 and the third ground conductor 23 are located at a position close to the power transmission line 40. Accordingly, the indirect unwanted coupling between the first signal transmission line and the second signal transmission line through the power transmission line 40 is significantly reduced or prevented effectively.

Third Preferred Embodiment

Figure 8:
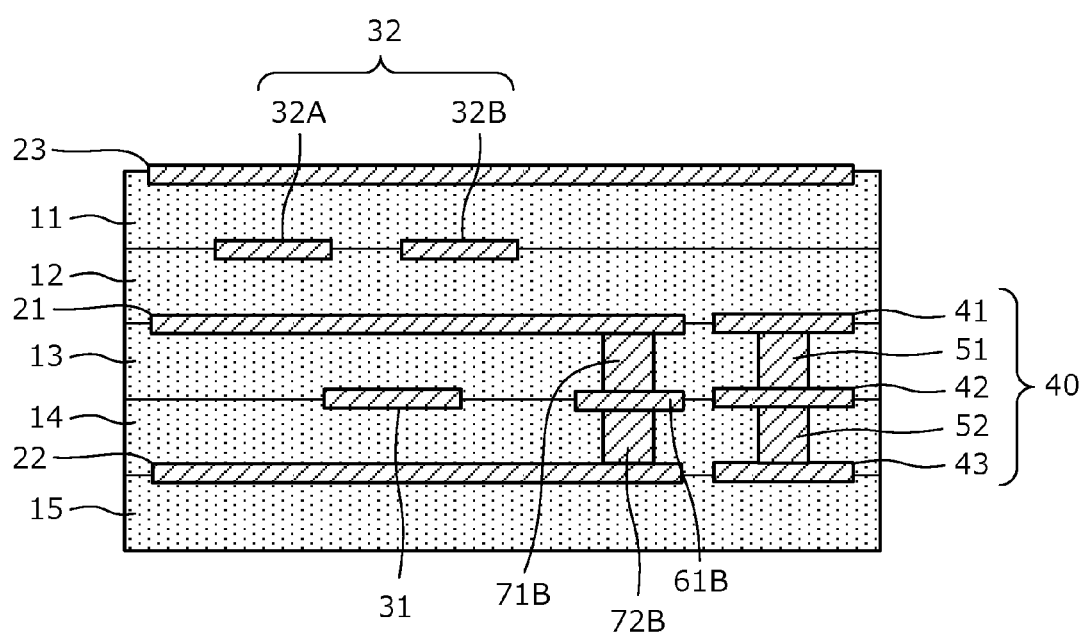
FIG. 8 is a cross-sectional view of a composite transmission line 3A according to a third preferred embodiment of the present invention.
Figure 9:
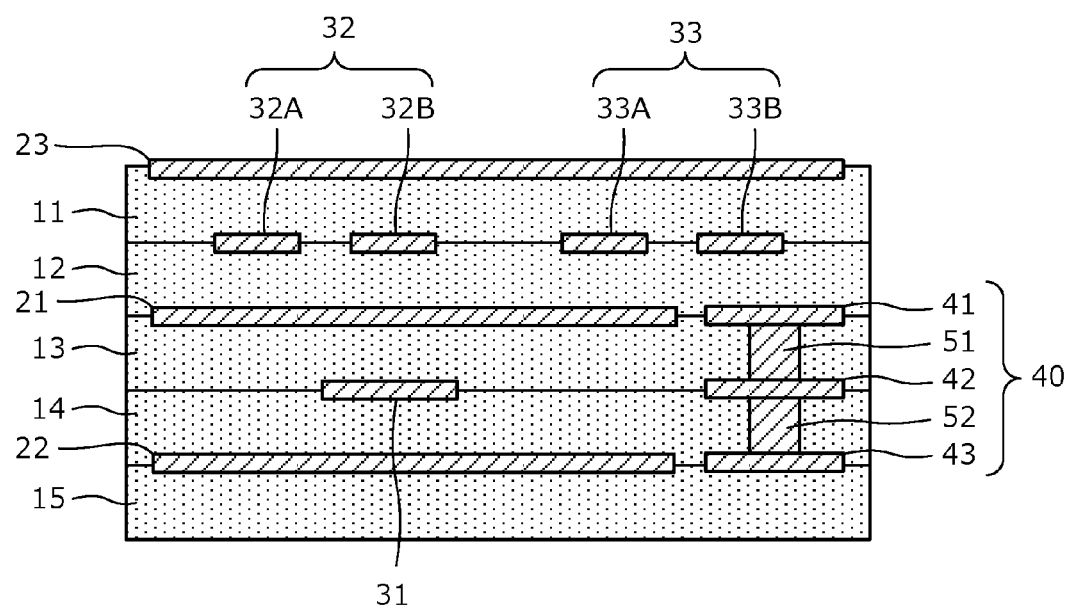
FIG. 9 is a cross-sectional view of a composite transmission line 3B according to the third preferred embodiment of the present invention.

According to a third preferred embodiment of the present invention, a description is given of several transmission lines that are partially different in the structure of the power transmission line from the transmission line 1 described in the first and second preferred embodiments. FIG. 8 is a cross-sectional view of the transmission line 3A, and FIG. 9 is a cross-sectional view of the transmission line 3B. The third preferred embodiment is different in the position of the power transmission line 40 in particular from the first and second preferred embodiments.

In the transmission line 3A illustrated in FIG. 8, the power transmission conductor patterns 41, 42, and 43 are respectively provided on the upper surfaces of the insulator layers 13, 14, and 15. The interlayer connection conductor 51 that interlayer-connects the power transmission conductor patterns 41 and 42 is provided in the insulator layer 13, and the interlayer connection conductor 52 that interlayer-connects the power transmission conductor patterns 42 and 43 is provided in the insulator layer 14. Other basic configurations are the same as the basic configuration of the transmission lines described in the first and second preferred embodiments.

In this way, the power transmission line 40 is located in the side portion of the first signal transmission line defined by the first signal conductor pattern 31, the first ground conductor 21, and the second ground conductor 22. In addition, the power transmission line 40 is located at a position (height) closer to the first signal conductor pattern 31 than to the second signal conductor patterns 32A and 32B, in the laminating direction of the insulator layers. In particular, in an example illustrated in FIG. 8, the side portion of the first signal transmission line is covered with the power transmission line 40. Accordingly, the interference between the first signal transmission line and the second signal transmission line through the power transmission line 40 is significantly reduced or prevented. The distance between the power transmission line 40 and the second signal conductor patterns 32A and 32B is relatively larger as compared with the distance between the power transmission line 40 and the first signal conductor pattern 31. Therefore, even though a conductor such as the interlayer connection conductors 73B and 74B and the conductor pattern 62B is not provided, the power transmission line 40 and the second signal conductor patterns 32A and 32B are able to be significantly reduced or prevented from interfering.

The transmission line 3B illustrated in FIG. 9 also includes the power transmission line 40 in the same layer (the same height) as the first signal transmission line. According to the structure, an area in the plane direction in which the second signal conductor pattern is able to be disposed is expanded. In the transmission line 3B, other second signal conductor patterns 33A and 33B in addition to the second signal conductor patterns 32A and 32B are also provided. The second signal transmission line by the second signal conductor patterns 33A and 33B is a differential (balanced) line and transmits a digital signal, for example.

It is to be noted that the transmission line 3B illustrated in FIG. 9 as well as the example of FIG. 8 may also include the interlayer connection conductors 71B and 72B and the conductor pattern 61B may be provided between the first signal conductor pattern 31 and the power transmission line 40. With this configuration, it is possible to significantly reduce or prevent the interference between the power transmission line 40 and the first signal conductor pattern 31. In addition, the indirect unwanted coupling between the first signal transmission line and the second signal transmission line through the power transmission line 40 is significantly reduced or prevented effectively.

According to the present preferred embodiment, by displacing the power transmission line 40 in the direction of an insulator layer on which the first signal conductor pattern 31 that is smaller in number than the second signal conductor patterns 32A, 32B, 33A, and 33B is located, it is possible to expand a space in a width direction. In other words, space efficiency is able to be achieved. In addition, since a relatively large number of conductors become difficult to be overlapped in the thickness direction, the flexible property of the transmission lines becomes difficult to be obstructed. It is to be noted, in particular, a portion of the power transmission line 40 may preferably be located in the same layer as the first signal conductor pattern 31.

Fourth Preferred Embodiment

According to a fourth preferred embodiment of the present invention, a description is given of a transmission line 4 that is partially different in structure from the transmission line 3B described in the third preferred embodiment.

Figure 10:
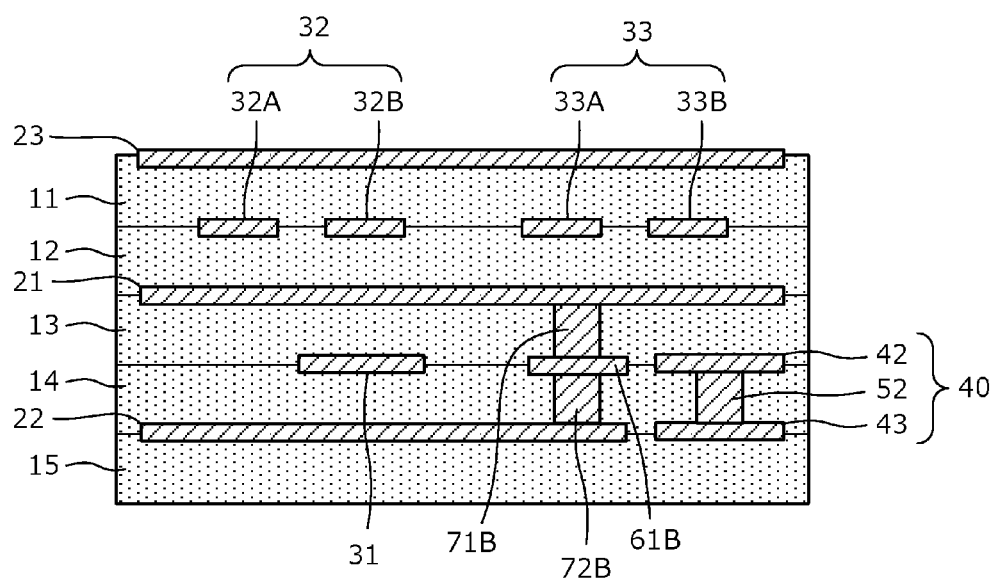
FIG. 10 is a cross-sectional view of a composite transmission line 4 according to a fourth preferred embodiment of the present invention.

FIG. 10 is a cross-sectional view of the transmission line 4. Unlike the transmission line 3B illustrated in FIG. 9, the interlayer connection conductors 71B and 72B and the conductor pattern 61B are provided between the first signal conductor pattern 31 and the power transmission line 40. In addition, the conductor patterns 42 and 43 and the interlayer connection conductor 52 define the power transmission line 40. Further, the first ground conductor 21 is extended to between the power transmission line 40 and the second signal conductor pattern 33B. Other configurations are the same as the configuration of the transmission line 3B.

According to the present preferred embodiment, since the first ground conductor 21 covers the upper portion of the power transmission line 40, sufficient isolation between the first signal conductor pattern 31 and the second signal conductor patterns 32 and 33 is ensured, and the isolation between the power transmission line 40 and the second signal conductor pattern 33 is further improved.

Fifth Preferred Embodiment

According to a fifth preferred embodiment of the present invention, a description is given of a transmission line that is different in the structure of the power transmission line from the transmission line 1 described in the first preferred embodiment.

Figure 11:
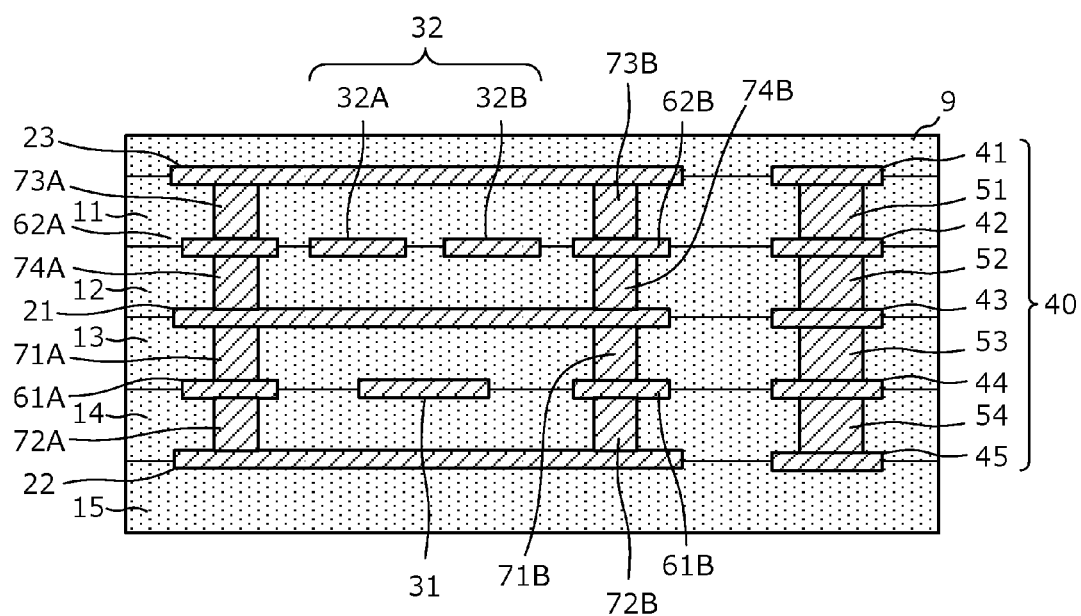
FIG. 11 is a cross-sectional view of a composite transmission line 1E according to a fifth preferred embodiment of the present invention.

FIG. 11 is a cross-sectional view of a transmission line 1E according to the fifth preferred embodiment of the present invention. The transmission line 1E is different in the structure of the power transmission line 40 from the transmission line 1 illustrated in FIG. 4 in the first preferred embodiment.

In the transmission line 1E according to the present preferred embodiment, the power transmission line 40 is defined by the power transmission conductor patterns 41, 42, 43, 44, and 45 and the interlayer connection conductors 51, 52, 53, and 54. This power transmission line 40 may preferably be disposed over the insulator layers of the laminated insulator from the insulator layer on which the second ground conductor 22 is located to the insulator layer on which the third ground conductor 23 is located. In addition, according to the present preferred embodiment, the width of the interlayer connection conductors 51 to 54 of the power transmission line 40 is larger than the width of the interlayer connection conductors 71A, 71B, 72A, 72B, 73A, and 73B that connect the first ground conductor 21, the second ground conductor 22, and the third ground conductor 23. Other configurations are the same as the configuration of the transmission line 1 described in the first preferred embodiment. The interlayer connection conductor 51, 52, 53 and 54 corresponds to the "first interlayer connection conductor".

According to the present preferred embodiment, the space from the insulator layer on which the second ground conductor 22 is located to the insulator layer on which the third ground conductor 23 is located is used effectively and thus a conductor loss of the power transmission line is reduced. Moreover, according to the present preferred embodiment, since the width of the interlayer connection conductor of the power transmission line 40 is large, the conductor loss of the power transmission line is further reduced.

Sixth Preferred Embodiment

According to a sixth preferred embodiment of the present invention, a description is given of a transmission line that is different in the structure of the power transmission line from the transmission line 1 described in the first preferred embodiment.

Figure 12:
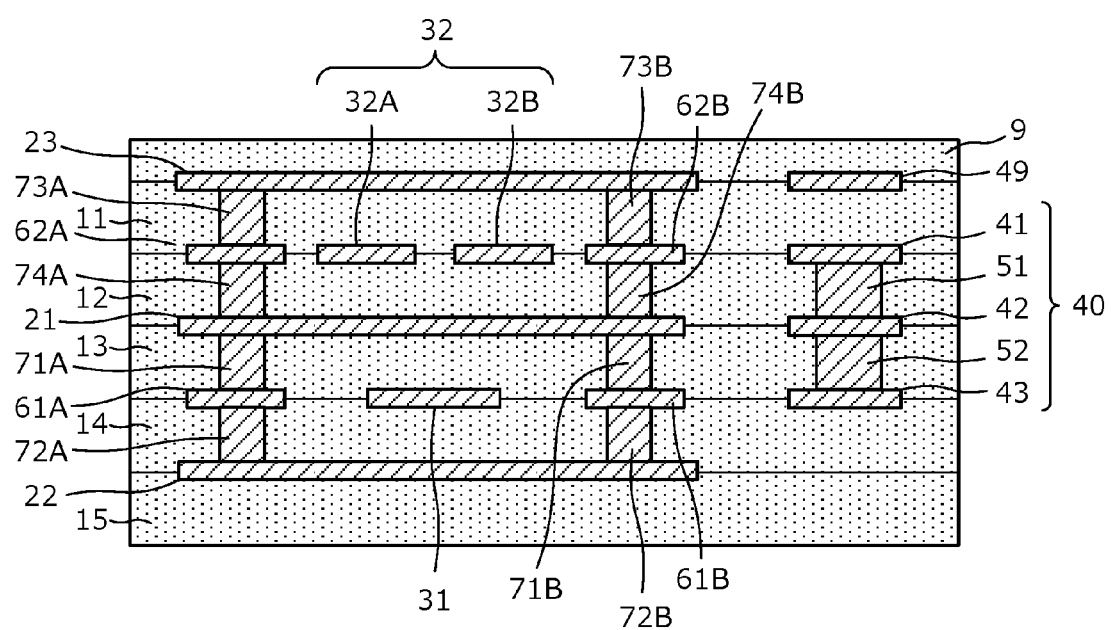
FIG. 12 is a cross-sectional view of a composite transmission line 1F according to a sixth preferred embodiment of the present invention.

FIG. 12 is a cross-sectional view of a transmission line 1F according to the sixth preferred embodiment of the present invention. The transmission line 1F is different in the structure of the power transmission line 40 from the transmission line 1 illustrated in FIG. 4 in the first preferred embodiment.

In FIG. 12, the power transmission line 40 is defined by the power transmission conductor patterns 41, 42, and 43 and the interlayer connection conductors 51 and 52. In addition, the power transmission line 40 further includes a power transmission ground conductor 49 that is electrically separated from the first ground conductor 21 (thus also electrically separated from the second ground conductor 22 and the third ground conductor 23).

In this way, higher isolation between the ground of the power transmission line and the ground of the signal transmission line is achieved by providing a ground conductor dedicated for power transmission, that is, a ground conductor for power supply. In addition, since the power supply line that is defined by the power transmission line 40 and the power transmission ground conductor 49 is a balanced line of which the polarity is reversed, even if this power supply line is combined with the first signal conductor pattern 31 or the second signal conductor pattern 32, a signal that is superimposed on the power supply line by electromagnetic coupling is offset by the power transmission line 40 and the power transmission ground conductor 49. Therefore, the power supply line is less likely to be adversely affected by the electromagnetic coupling.

Seventh Preferred Embodiment

According to a seventh preferred embodiment of the present invention, a description is given of an example that is different in the structure of the power transmission line from the preferred embodiments that have been described.

Figure 13A:
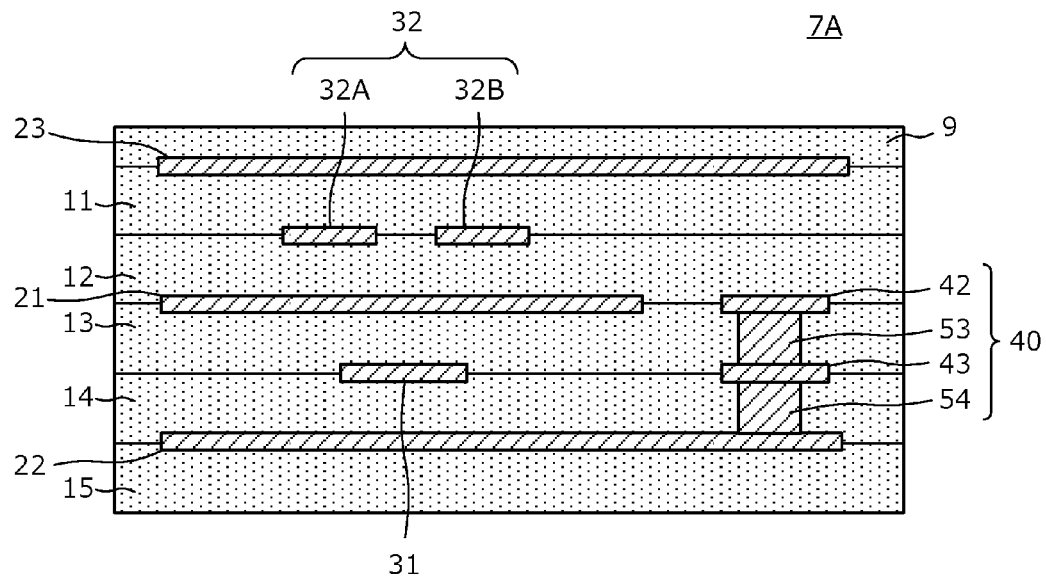
FIG. 13A is a cross-sectional view of a composite transmission line 7A according to a seventh preferred embodiment of the present invention.

FIG. 13A is a cross-sectional view of a transmission line 7A according to the seventh preferred embodiment of the present invention. The power transmission line 40 is defined by the power transmission conductor patterns 42 and 43 and the interlayer connection conductors 53 and 54. In addition, the power transmission line 40 is electrically connected to the second ground conductor 22. In this example, the first ground conductor 21 or the third ground conductor 23 is able to be used as a counter electrode of the power transmission line 40. For example, the first ground conductor 21 or the third ground conductor 23 is used as a ground conductor of the power supply line, and the power transmission line 40 and the second ground conductor 22 are used as a power supply line. In other words, power is transmitted by the power transmission line 40, the second ground conductor 22, and the first ground conductor 21. Alternatively, the power is transmitted by the power transmission line 40, the second ground conductor 22, and the third ground conductor 23.

In this transmission line 7A, the second ground conductor 22 defines and functions as a portion of the power transmission line. Therefore, the conductor loss of the power transmission line is reduced. In addition, heat dissipation is also increased. Further, the power transmission line 40 defines and functions as a ground conductor of the first signal transmission line defined by the first signal conductor pattern 31, the first ground conductor 21, and the second ground conductor 22. Accordingly, the shielding property of the first signal transmission line is increased.

Figure 13B:
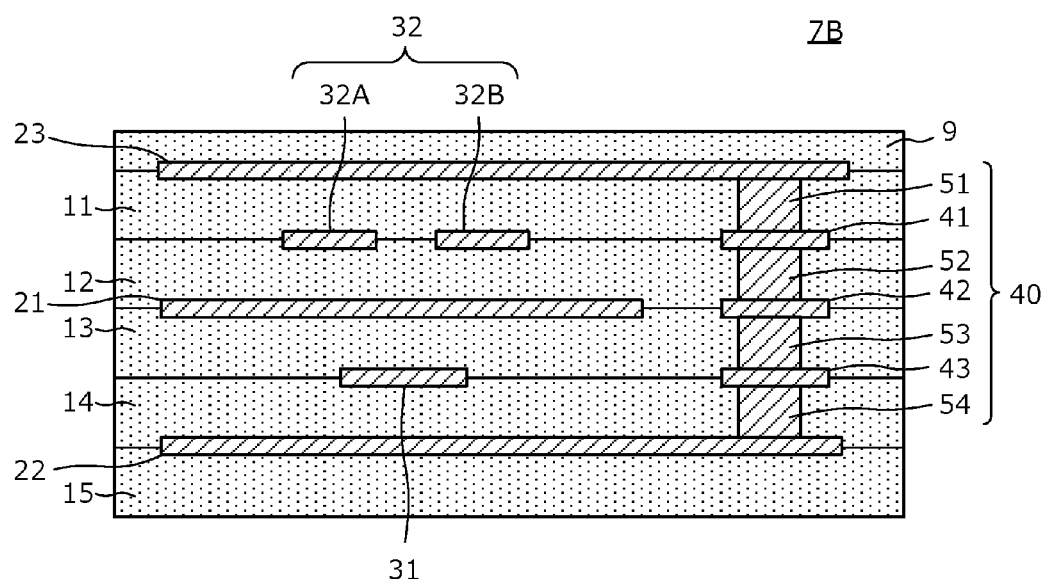
FIG. 13B is a cross-sectional view of another composite transmission line 7B according to the seventh preferred embodiment of the present invention.

FIG. 13B is a cross-sectional view of another transmission line 7B according to the seventh preferred embodiment of the present invention. The power transmission line 40 is defined by the power transmission conductor patterns 41, 42, and 43 and the interlayer connection conductors 51, 52, 53, and 54. In addition, the power transmission line 40 is electrically connected to the second ground conductor 22 and the third ground conductor 23 individually. In this example, the first ground conductor 21 is able to be used as a counter electrode of the power transmission line 40. For example, the first ground conductor 21 is used as a ground conductor of the power supply line, and the power transmission line 40, the second ground conductor 22, and the third ground conductor 23 are used as a power supply line.

In this transmission line 7B, the second ground conductor 22 and the third ground conductor 23 define and function as a portion of the power transmission line. Therefore, the conductor loss of the power transmission line is reduced. In addition, heat dissipation is also increased. Further, the power transmission line 40 defines and functions as a ground conductor of the first signal transmission line defined by the first signal conductor pattern 31, the first ground conductor 21, and the second ground conductor 22. Similarly, the power transmission line 40 defines and functions as a ground conductor of the second signal transmission line defined by the second signal conductor pattern 32, the first ground conductor 21, and the third ground conductor 23. Accordingly, the shielding property of the first signal transmission line and the second signal transmission line is increased.

Eighth Preferred Embodiment

According to an eighth preferred embodiment of the present invention, a description is given of an example of a transmission line that includes a bent portion.

Figure 14:
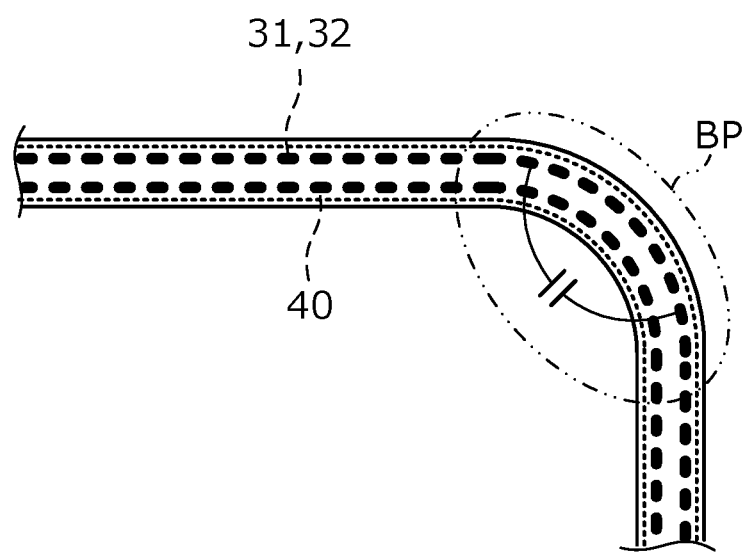
FIG. 14 is a plan view of a composite transmission line 18 according to an eighth preferred embodiment of the present invention.

FIG. 14 is a plan view of a transmission line 18 according to the eighth preferred embodiment of the present invention. However, in FIG. 14, the first signal conductor pattern and the second signal conductor pattern are schematically illustrated as a single linear pattern.

A cross-sectional structure of the first signal conductor pattern 31 and the second signal conductor pattern 32 and the power transmission line 40 of the power transmission line 18 is preferably the same as the cross-sectional structure that has been described mainly in the first preferred embodiment. The transmission line 18 may preferably include a bent portion BP that bends in a direction (plane direction) perpendicular or substantially perpendicular to the laminating direction of the plurality of insulator layers, and, in a plan view of the plurality of insulator layers, the power transmission line 40 may preferably be located closer to the inner peripheral side than to the first signal conductor pattern 31 and the second signal conductor pattern 32.

According to the present preferred embodiment, since the curvature radius of the first signal conductor pattern 31 and the second signal conductor pattern 32 in the bent portion BP is kept large and distance is able to be separated, the interference between the first signal conductor patterns 31 or between the second signal conductor patterns 32 in the bent portion BP is reduced. The symbol of a capacitor in FIG. 14 indicates a parasitic capacitance generated between the first signal conductor patterns 31, and a parasitic capacitance generated between the second signal conductor patterns 32. Such a parasitic capacitance is the cause of distortion of a transmission signal. In the present preferred embodiment, the transmission signal is also significantly reduced or prevented from being distorted due to the parasitic capacitance in the bent portion BP.

In addition, since, in the bent portion BP, the power transmission line 40 is located between the first signal conductor patterns 31, the first signal conductor patterns 31 are shielded by the power transmission line 40, and the interference between the first signal conductor patterns 31 is also significantly reduced or prevented by the shielding action. Similarly, the interference between the second signal conductor patterns is significantly reduced or prevented.

Ninth Preferred Embodiment

According to a ninth preferred embodiment of the present invention, a description is given of an example of a transmission line provided with a plurality of power transmission lines.

Figure 15:
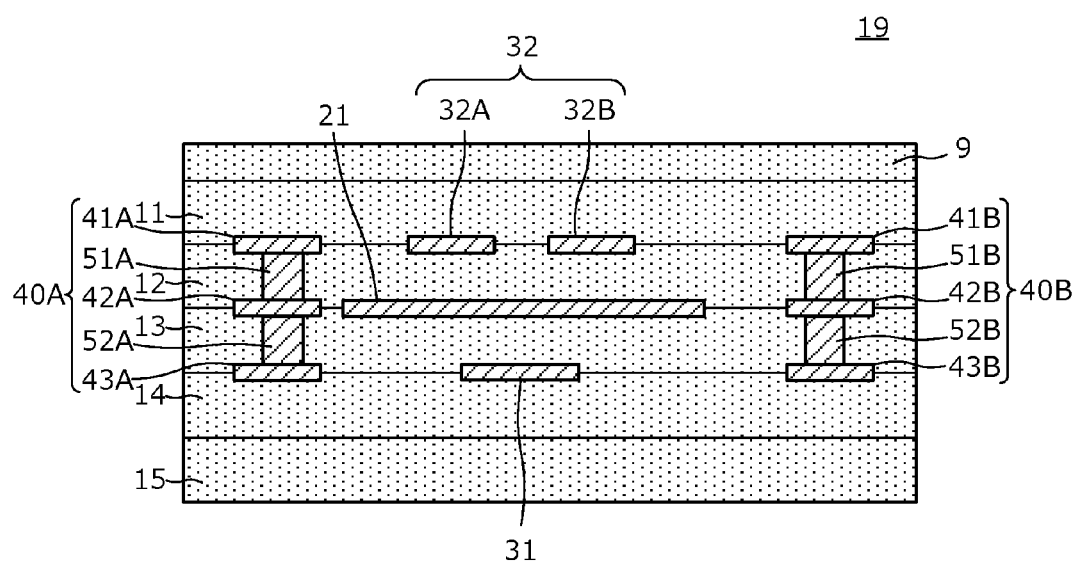
FIG. 15 is a cross-sectional view of a composite transmission line 19 according to a ninth preferred embodiment of the present invention.

FIG. 15 is a cross-sectional view of a transmission line 19 according to the ninth preferred embodiment of the present invention. In the example illustrated in FIG. 15, two power transmission lines 40A and 40B are provided. The power transmission line 40A is defined by the power transmission conductor patterns 41A, 42A, and 43A and the interlayer connection conductors 51A and 52A. In addition, the power transmission line 40B is defined by the power transmission conductor patterns 41B, 42B, and 43B and the interlayer connection conductors 51B and 52B. The first signal conductor pattern 31 and the first ground conductor 21 define the first signal transmission line of a microstrip line type. Moreover, the second signal conductor patterns 32A and 32B and the first ground conductor 21 define the second signal transmission line of a differential line.

The power transmission lines 40A and 40B may preferably be respectively located in side portions located on the opposite sides of the first signal conductor pattern 31 and the second signal conductor pattern 32.

According to the present preferred embodiment, in the vertical section of the laminated insulator, at least the power transmission line has a symmetrical shape, which significantly reduces or prevents the laminated insulator from being warped or twisted.

Tenth Preferred Embodiment

Figure 16A:
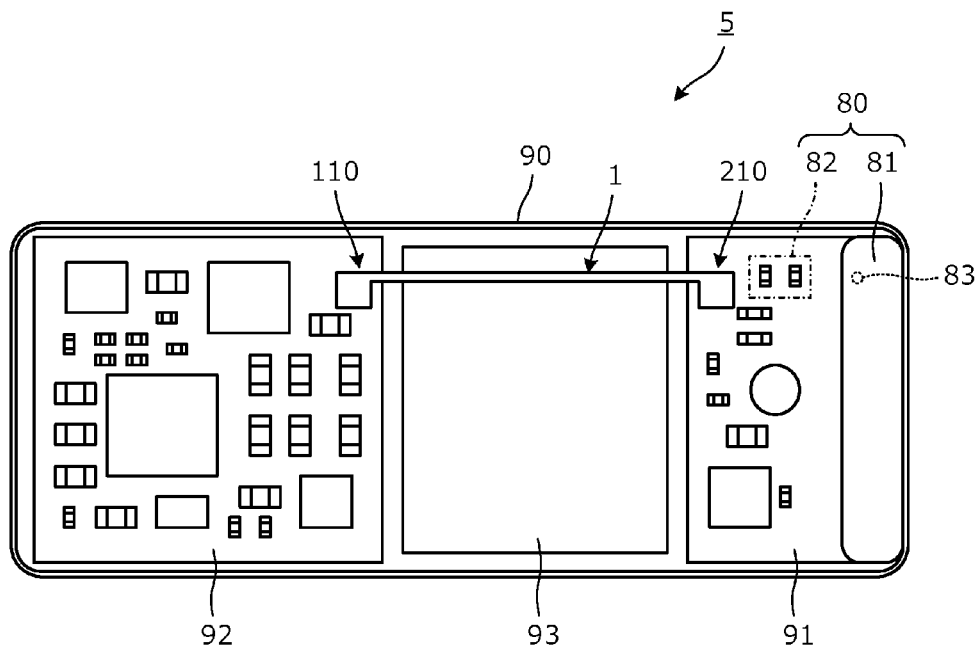
FIG. 16A is a plan view of the inside of a housing of a mobile electronic device 5, the plan view illustrating the mounting state of a composite transmission line 1 according to a tenth preferred embodiment of the present invention.
Figure 16B:
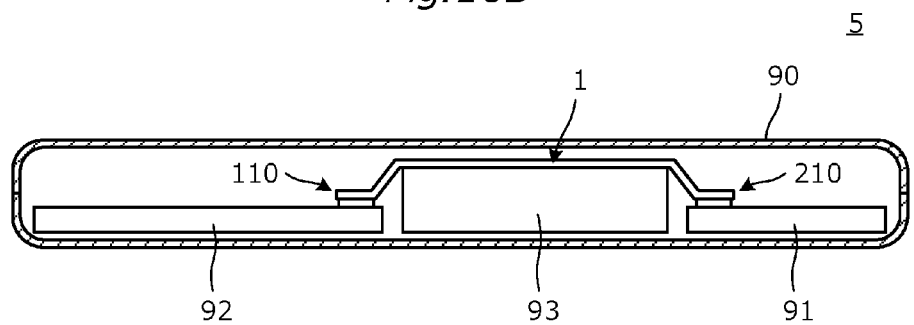
FIG. 16B is a schematic cross-sectional view illustrating the mounting state of the composite transmission line 1 in the housing of the mobile electronic device 5.

FIG. 16A is a plan view of the inside of a housing of a mobile electronic device 5 illustrating the mounting state of a transmission line 1 according to a tenth preferred embodiment of the present invention, and FIG. 16B is a schematic cross-sectional view illustrating the mounting state of the transmission line 1 in the housing of the mobile electronic device 5.

The mobile electronic device 5 is provided with a thin housing 90. In the housing 90, circuit boards 91 and 92, a battery pack 93, and the like are provided. A plurality of electronic components are mounted on the surfaces of the circuit boards 91 and 92.

In the housing 90, an antenna portion 80 is defined by a radiating element 81 and an antenna matching circuit 82. The antenna matching circuit 82 on the circuit board 91 is connected to the radiating element 81 through a connection pin 83. An RFIC is mounted on the circuit board 92 and an antenna signal in the 2 GHz band (high-frequency analog signal), for example, is transmitted from the circuit board 92 to the circuit board 91. In addition, a digital signal such as an MIPI (registered trademark) and a USB is transmitted between the circuit board 91 and the circuit board 92. Moreover, electric power supplied from the battery pack 93 and the like is transmitted between the circuit board 91 and the circuit board 92. As described above, one transmission line 1 transmits two kinds of signals and also transmits power.

The circuit boards 91 and 92 and the battery pack 93 are located in the housing 90 so that, in a plan view of the housing 90, the battery pack 93 may be located between the circuit boards 91 and 92. Since the housing 90 is as thin as possible, the space between the battery pack 93 and the housing in the thickness direction of the housing 90 is extremely narrow. Therefore, it is difficult to provide a plurality of cables, such as ordinary coaxial cables, between the battery pack 93 and the housing 90.

The transmission line 1 according to the present preferred embodiment is structured such that the thickness direction of the transmission line 1 coincides with the thickness direction of the housing 90 and thus the transmission line 1 is able to be passed between the battery pack 93 and the housing 90. Thus, the circuit boards 91 and 92 spaced from each other with the battery pack 93 disposed in the middle are able to be connected to each other by the transmission line 1.

Further, even in a case in which a position in which the transmission line 1 is connected to the circuit boards 91 and 92 and a surface of the transmission line 1 on which the battery pack 93 is installed are different in the thickness direction of the housing 90 and thus the transmission line 1 needs to be curved to be connected, the structure according to the present preferred embodiment is applicable.

Other Preferred Embodiments

In the preferred embodiments of the present invention described above, while an example in which a via filled up with a conductor in a hole in the insulator layer is used as the interlayer connection conductor has been described, the interlayer connection conductor may be defined by a through hole obtained by providing a conductive film on the inner surface of the hole in addition to the via filled up with a conductor in the hole formed in the insulator layer.

Although, in the example illustrated in FIG. 1, the protective insulating film 9 is located on the surface of the laminated insulator 10 on which each connector of the laminated insulator 10 is placed, the protective insulating film 9 is not essential.

In addition, neither the second ground conductor 22 nor the third ground conductor 23 is essential. Moreover, the interlayer connection conductors that connect such ground conductors are not essential, either.

The number of first and second transmission lines is not limited to the combination of "two lines and one line" or "four lines and one line". For example, a combination of five lines and two lines may be preferable. Even in such a case, by displacing the power transmission line 40 in the direction of an insulator layer on which the first signal conductor pattern that is small in number is provided, the above described operational effects and advantages are able to be obtained.

Finally, the foregoing preferred embodiments are illustrative in all points and should not be construed to limit the present invention. It is to be understood that variations and modifications will be apparent to those skilled in the art without departing from the scope and spirit of the present invention. For example, configurations illustrated in different preferred embodiments are able to be partially replaced and combined with each other. The scope of the present invention is defined not by the foregoing preferred embodiment but by the following claims. Further, the scope of the present invention is intended to include all modifications within the scopes of the claims and within the meanings and scopes of equivalents.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. A composite transmission line comprising:
a plurality of signal transmission lines;
a power transmission line; and
a laminated insulator in which a plurality of insulator layers are laminated on each other, the laminated insulator including the plurality of signal transmission lines and the power transmission line; wherein
the plurality of signal transmission lines include at least a first signal transmission line and a second signal transmission line;
the first signal transmission line includes a first signal conductor pattern;
the second signal transmission line includes a second signal conductor pattern;
the power transmission line includes:
   a power transmission conductor pattern defined by power transmission conductor patterns along the plurality of insulator layers of the laminated insulator; and
   a first interlayer connection conductor that interlayer-connects the power transmission conductor patterns; wherein
the first signal conductor pattern, the second signal conductor pattern, and the power transmission conductor pattern extend in a same or substantially same direction;

the first signal conductor pattern and the second signal conductor pattern interpose a first ground conductor between the first signal conductor pattern and the second signal conductor pattern in a laminating direction of the plurality of insulator layers; and the power transmission line is in a side portion of the first signal conductor pattern.

2. The composite transmission line according to claim 1, wherein the power transmission line is in a side portion of the first signal conductor pattern and the second signal conductor pattern.

3. The composite transmission line according to claim 1, wherein the first signal transmission line is an unbalanced line for a high-frequency analog signal and the second signal transmission line is a differential line for a digital signal.

4. The composite transmission line according to claim 3, wherein the power transmission line is at a position closer to the first signal conductor pattern than to the second signal conductor pattern, in the laminating direction of the plurality of insulator layers.

5. The composite transmission line according to claim 4, wherein a number of second signal conductor patterns is larger than a number of first signal conductor patterns.

6. The composite transmission line according to claim 1, wherein a second ground conductor is located on a side opposite to the first ground conductor, with respect to the first signal conductor pattern.

7. The composite transmission line according to claim 6, wherein the second ground conductor and the first ground conductor are connected to each other through a second interlayer connection conductor, at a position closer to the power transmission line than to the first signal conductor pattern.

8. The composite transmission line according to claim 6, wherein the second ground conductor and the first ground conductor are connected to each other through a third interlayer connection conductor, at a position on a side opposite to the power transmission line, with respect to the first signal conductor pattern.

9. The composite transmission line according to claim 6, wherein the power transmission line is electrically connected to at least the second ground conductor.

10. The composite transmission line according to claim 9, wherein:

a third ground conductor is located on a side opposite to the first ground conductor, with respect to the second signal conductor pattern; and the power transmission line is electrically connected to the third ground conductor.

11. The composite transmission line according to claim 1, further comprising a power transmission ground conductor that is electrically separated from the first ground conductor.

12. The composite transmission line according to claim 1, wherein a third ground conductor is located on a side opposite to the first ground conductor, with respect to the second signal conductor pattern.

13. The composite transmission line according to claim 12, wherein the third ground conductor and the first ground conductor are connected to each other through a fourth interlayer connection conductor.

14. The composite transmission line according to claim 13, wherein the fourth interlayer connection conductor is located on both sides across the second signal conductor pattern in a width direction.

15. The composite transmission line according to claim 12, wherein the power transmission line extends over the plurality of insulator layers of the laminated insulator from an insulator layer including the second ground conductor to an insulator layer including the third ground conductor.

16. The composite transmission line according to claim 1, wherein an external connection terminal that is electrically connected to the first signal transmission line and the second signal transmission line is located near or adjacent to the second signal transmission line of the laminated insulator.

17. The composite transmission line according to claim 1, wherein the laminated insulator has flexibility.

18. The composite transmission line according to claim 1, further comprising a bent portion that bends in a direction perpendicular or substantially perpendicular to the laminating direction of the plurality of insulator layers, wherein, in a plan view of the plurality of insulator layers, the power transmission line is located closer to an inner peripheral side than to the first signal conductor pattern and the second signal conductor pattern.

19. The composite transmission line according to claim 1, wherein the power transmission line is in the side portion located on both sides of the plurality of signal transmission lines.

20. An electronic device comprising:

the composite transmission line according to claim 1;
a first high-frequency circuit; and
a second high-frequency circuit; wherein
the first high-frequency circuit and the second high-frequency circuit are connected to each other by the composite transmission line.

* * * * *